Feb. 13, 1951 H. B. R. BOOSMAN ET AL 2,541,329
APPARATUS FOR THE REMOTE CONTROL OF A TUNABLE RADIO FREQUENCY CONVERTING SYSTEM
Filed July 20, 1946
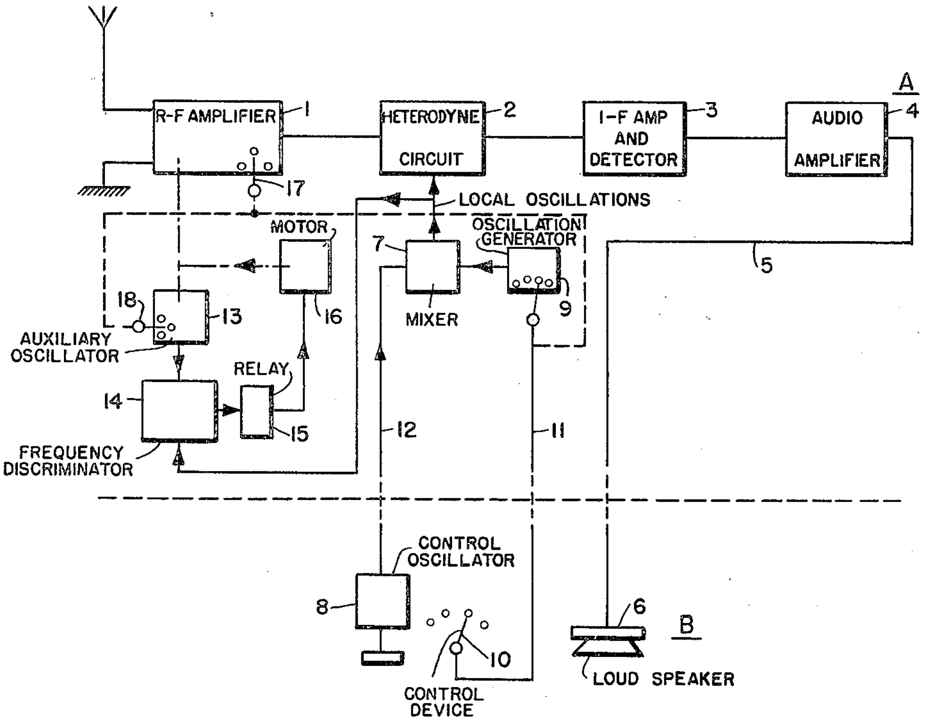
INVENTORS
HERMAN BERNARD RUDOLF BOOSMAN
EDUARD HERMAN HUGENHOLTZ
BY Fred M Vogel
AGENT Patented Feb. 13, 1951 2,541,329

UNITED STATES PATENT OFFICE 2,541,329

APPARATUS FOR THE REMOTE CONTROL OF A TUNABLE RADIO FREQUENCY CONVERTING SYSTEM

Herman Bernard Rudolf Boosman and Eduard Herman Hugenholtz, Eindhoven, Netherlands, assignors to Hartford National Bank and Trust Company, Hartford, Conn., as trustee Application July 20, 1946, Serial No. 685,125
In the Netherlands July 9, 1943

Section 1, Public Law 690, August 8, 1946
Patent expires July 9, 1963

4 Claims. (Cl. 250—20)

This invention relates to an apparatus tunable from a remote point of control, and more particularly to a radio transmitter or receiver, whose tuning frequency is determined by the frequency of at least one oscillator.

For the remote control of apparatus whose tuning frequency is determined by the frequency of an oscillator, it is known to adjust the oscillator from the point of control of the apparatus and to make non-resonant any additional circuits not pertaining to the oscillator, so that they need not be tuned.

Also in those cases in which for the said oscillatory circuits the frequency bands into which the whole of the frequency range to be covered is subdivided, should be chosen different from those for the said oscillator, as, for example, is sometimes the case with direction-finding receivers, the tuning of the circuits not pertaining to the oscillator has hitherto been omitted.

This invention provides means with the aid of which all the tunable oscillatory circuits can be tuned from a distance in a simple manner.

According to the invention, the oscillator frequency is adjusted from the remote point of control, while an auxiliary oscillation whose frequency is determined by the oscillator frequency brings the tuning frequency of the said oscillatory circuits into correspondence with the adjusted oscillator frequency by means of a frequency detector.

To the frequency detector is preferably supplied, in addition, a second auxiliary oscillation whose frequency depends on the tuning frequency of the said oscillatory circuits. In this case the two auxiliary oscillations are compared, with respect to their frequencies, in the frequency detector, while as the result of this comparison the tuning frequency of the said oscillatory circuits is brought into agreement with the adjusted oscillator frequency.

The invention may be applied more particularly to apparatus whose tuning frequency is determined by the sum or the difference of the frequencies of two or more oscillators, one of which is adjustable by steps and the other continuously.

In this case the remote control is effected, in accordance with the invention, in such manner that the oscillator adjustable by steps is arranged near the apparatus and is controlled from the remote point of control and the continuously adjustable oscillator is arranged at the point of control and is directly adjusted at this point.

Such an apparatus is preferably constructed in such manner that an oscillation obtained by mixing the frequencies generated by the said oscillators determines the tuning frequency of the apparatus.

The arrangement described offers the advantage that the fine tuning of the apparatus obtained by means of the continuously adjustable oscillator follows immediately, without delay, after the adjustment of the corresponding member for the remote control, for if this fine adjustment is effected by means of any of the usual methods of remote control, there always elapses a certain period of time between the adjustment of the remote control member and the instant at which the member for the fine tuning of the apparatus attains the position which corresponds to the chosen adjustment. When tuning transmitters and receivers—especially direction-finding receivers to which the invention applies more particularly—such a delay is extremely troublesome, so that rapid as well as exact tuning becomes quite impossible.

The first auxiliary oscillation is preferably taken from any of the said oscillators or obtained by mixing oscillations generated by these oscillators.

The adjustment of the said oscillatory circuits is preferably effected in such manner that the tuning is always varied until the two auxiliary oscillations exhibit a fixed frequency difference, which difference is chosen in such manner that the second auxiliary oscillation cannot give rise to the production of a troublesome interference tone.

In order that the invention may be clearly understood and readily carried into effect, it will now be described more fully with respect to the accompanying drawing, which represents, by way of example, one form of construction.

The drawing represents a superheterodyne receiver constructed for remote control. The receiver is arranged at the point of reception A and is connected by means of conductors to the remote control means located at the point of control B.

The receiver comprises a high-frequency amplifier 1, a mixing stage 2, an intermediate-frequency amplifier 3 and a detector and low-frequency amplification stage 4. The amplified low-frequency oscillations are supplied, through the intermediary of a conductor 5, to a loudspeaker 6, which is arranged at the point of control B.

The local oscillations for the receiver are formed in the mixing stage 7 to which are supplied both the oscillations of a continuously variable oscillator 8 (located at the point of control B and controlled there) and the oscillations of the stepwise adjustable oscillator 9 (located near the receiver). The oscillator 9 is adjusted from a distance in a manner known in itself; the device used for this purpose is denoted in the drawing by 10 and is connected to a mixing stage 7 by means of a conductor 12.

The oscillations obtained by mixing in the mixing stage 7 are supplied to the mixing stage 2 where they act as local oscillations. Let us assume that the receiver is intended for receiving a frequency range of from 3 to 12 mc./s. and that the intermediate frequency is 400 kc./s. The local oscillations must in this case be variable through a range of from 3.4 to 12.4 mc./s. This may be achieved, for example, by making the oscillator 9 adjustable by steps to the frequencies 2, 3, 4 . . . 9, 10 mc./s. and by making the oscillator 8 continuously adjustable through a frequency band of from 1.4 to 2.4 mc./s. By combining each time a selected frequency of the oscillator 9 with the frequency band of the oscillator 8, it is possible to cover the whole range in which the local oscillations must be varied.

Since the frequency of the local oscillations is directly related to the tuning frequency of the oscillator 9, the receiver is tuned at the same moment at which the member for the remote control of the fine adjustment (in the present case the tuning condenser of the oscillator 8) is adjusted. Consequently there does not occur a troublesome delay between the tuning of the apparatus and the adjustment of the remote control device.

The tuning of the oscillatory circuits pertaining to the high-frequency portion of the receiver is effected with the aid of a generator 13 which generates a second auxiliary oscillation whose frequency depends on the tuning frequency of these oscillatory circuits. To that end the tuning condenser of the generator 13 is mechanically coupled to the tuning condensers of the said high-frequency portion. The local oscillations themselves are utilized as the first auxiliary oscillation. The second auxiliary oscillation and the local oscillations are both supplied to a frequency detector 14. From this frequency-detector 14 is taken a control voltage which energizes a relay 15. This relay actuates a motor 16 which is coupled to the tuning condensers of the high-frequency portion and to the tuning condenser of the generator 13. The motor moves the tuning condensers until the frequencies of the second auxiliary oscillation and of the local oscillations are equal. When this equality is attained the relay 15 and the motor 16 are switched off. Since in the example given the local oscillations vary from 3.4 to 12.4 mc./s., the frequency of the generator 13 also varies from 3.4 to 12.4 mc./s. The tuning of the high-frequency circuits covers in this case the frequency range of from 3 to 12 mc./s.

As a rule such a range cannot be covered without switching-over the fixed reactances pertaining to the oscillatory circuits of the high-frequency portion and of the generator 13.

Let us assume that the whole range of the high-frequency portion, which extends from 3 to 12 mc./s., is subdivided into three bands: 3–6, 6–9 and 9–12 mc./s.; in this case the generator 13 is also switched-over three times: 3.4–6.4, 6.4–9.4 and 9.4–12.4 mc./s. The change-over switch of the high-frequency portion 1 is designated by 17 and that of the generator 13 by 18. The change-over switches of the stepwise adjustable oscillator 9, of the high-frequency portion 1 and of the generator 13 are coupled to one another and this in such manner that to a number of steps of the oscillator 9 always corresponds the same position of the change-over switches 17 and 18, for example: to the frequencies 2, 3 and 4 mc./s. of the oscillator 9 correspond the band of from 3 to 6 mc./s. of the high-frequency portion 1 and the band of from 3.4 to 6.4 mc./s. of the generator 13, and so forth. Now the tuning condensers of the high-frequency portion 1 and of the generator 13 pass once through their whole range in the period of time in which the tuning condenser of the oscillator 8 passes three times through its range.

It is not always desirable to compare the oscillations of the generator 13 and the local oscillations with respect to equality, for if the frequency of the generator 13 does not become exactly equal to the frequency of the local oscillations, disturbances may arise under certain conditions due to interference between the said oscillations. This is the reason why it is sometimes preferred to compare the two oscillations with respect to a fixed differential frequency, said frequency being so chosen that any interference frequency which may occur does not have a detrimental effect on the operation of the apparatus. In the present case, this differential frequency may, for example, be taken larger than the intermediate-frequency bandwidth. This must, of course, be taken into account when constructing the generator 13.

What we claim is:

1. A remotely controlled frequency converting system comprising a radio frequency amplifier provided with continuous tuning means, a heterodyne circuit arranged to mix the output wave of said amplifier with local oscillations, a source of local oscillations for said heterodyne circuit provided with a remotely positioned control oscillator continuously tunable within a predetermined range and arranged to vary the frequency of said source of local oscillations, an auxiliary oscillator continuously tunable within a predetermined range, the tuning means of said amplifier being coupled for movement in accordance with the tuning of said auxiliary oscillator, means to compare the frequencies of said source and said auxiliary oscillator to develop a control voltage whose value depends on the frequency difference therebetween, and motive means responsive to said control voltage and coupled to tune said auxiliary oscillator to maintain a predetermined frequency relation between said auxiliary oscillator and said source, thereby effecting tracking between said source of local oscillations and the tuning of said amplifier.

2. A remotely controlled frequency converting system comprising a radio frequency amplifier provided with continuous tuning means, a heterodyne circuit arranged to mix the output wave of said amplifier with local oscillations, a source of local oscillations for said heterodyne circuit including a generator producing oscillations, a remotely positioned control oscillator continuously tunable within a predetermined range and a mixer for combining the frequencies of said generator and said control oscillator to produce local oscillations whose frequency is varied by the adjustment of said control oscillator, an auxiliary oscillator continuously tunable within a predetermined range, the tuning means of said amplifier being coupled for movement in accordance with the tuning of said auxiliary oscillator, means to compare the frequencies of said source and said auxiliary oscillators to develop a control voltage whose value depends on the frequency difference therebetween, and motive means responsive to said control voltage and coupled to tune said auxiliary oscillator to maintain a predetermined frequency relation between said auxiliary oscillator and said source, thereby effecting tracking between said source of local oscillations and the tuning of said amplifier.

3. A remotely controlled superheterodyne receiver comprising a radio frequency amplifier provided with tuning means, a heterodyne circuit arranged to mix the output wave of said amplifier with local oscillations to produce an intermediate frequency signal, a source of local oscillations for said heterodyne circuit provided with a remotely positioned control oscillator continuously tunable within a predetermined range and arranged to vary the frequency of said source of local oscillations, an auxiliary oscillator continuously tunable within a predetermined range, the tuning means of said amplifier being coupled for movement in accordance with the adjustment of said auxiliary oscillator, a frequency discriminator electrically coupled to said source and auxiliary oscillator to produce a control voltage whose value depends on the frequency difference therebetween, a motor arranged to adjust said auxiliary oscillator, and relay means responsive to said control voltage to effect energization of said motor in a direction maintaining synchronism between the frequencies of said source and said auxiliary oscillator, thereby effecting tracking between said source and the tuning of said amplifier.

4. A remotely controlled frequency converting system comprising a radio frequency amplifier provided with tuning means and a step-wise band switching mechanism, a heterodyne circuit arranged to mix the output wave of said amplifier with local oscillations, a source of local oscillations including a generator for producing oscillations and adjustable in frequency in a step-wise manner, a remotely positioned control oscillator continuously tunable within a predetermined range and a mixer for combining the output of said control oscillator and said generator to produce local oscillations for said heterodyne circuit, an auxiliary oscillator provided with a step-wise band switching mechanism and means to tune continuously throughout each band, the tuning means of said amplifier being coupled for movement with the tuning means of said auxiliary oscillator, a remotely positioned control device for simultaneously operating the step-wise adjustment means of said amplifier, said auxiliary oscillator and said generator, means to compare the frequencies of said source and said auxiliary oscillator to produce a control voltage whose value depends on the frequency difference therebetween, and motive means responsive to said control voltage and coupled to the continuous tuning means of said auxiliary oscillator to maintain a predetermined relation between said auxiliary oscillator and said source.

HERMAN BERNARD RUDOLF BOOSMAN.
EDUARD HERMAN HUGENHOLTZ.

REFERENCES CITED

The following references are of record in the file of this patent:

UNITED STATES PATENTS

| Number | Name | Date |
|---|---|---|
| 2,011,953 | Somers | Aug. 20, 1935 |
| 2,152,336 | Van Loon | Mar. 28, 1939 |
| 2,182,352 | Prochnow | Dec. 5, 1939 |
| 2,186,099 | Cutting et al. | Jan. 9, 1940 |
| 2,240,428 | Travis et al. | Apr. 29, 1941 |
| 2,270,023 | Ramsay et al. | Jan. 13, 1942 |
| 2,320,996 | Alexanderson | June 8, 1943 |
| 2,382,203 | Chandler | Aug. 14, 1945 |
| 2,394,869 | Nicholson | Feb. 12, 1946 |
| 2,414,100 | Hansen et al. | Jan. 14, 1947 |

FOREIGN PATENTS

| Number | Country | Date |
|---|---|---|
| 521,710 | Great Britain | May 29, 1940 |